(12) United States Patent
Song et al.

(10) Patent No.: US 8,957,413 B2
(45) Date of Patent: Feb. 17, 2015

(54) ORGANIC LIGHT EMITTING DIODE DISPLAY

(71) Applicant: Samsung Display Co., Ltd., Yongin, Gyeonggi-Do (KR)

(72) Inventors: Young-Woo Song, Yongin (KR); Jin-Koo Chung, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/141,311

(22) Filed: Dec. 26, 2013

(65) Prior Publication Data

US 2014/0183502 A1 Jul. 3, 2014

(30) Foreign Application Priority Data

Jan. 2, 2013 (KR) .................... 10-2013-0000181

(51) Int. Cl.
*H01L 51/52* (2006.01)
*H01L 27/32* (2006.01)

(52) U.S. Cl.
CPC ........ *H01L 51/5228* (2013.01); *H01L 27/3246* (2013.01); *H01L 2251/5315* (2013.01)
USPC .................. 257/40; 257/59; 257/88; 257/89; 257/E33.06

(58) Field of Classification Search
USPC .............. 257/40, 89, 59, 43, 72, 88, E29.121, 257/E33.06
See application file for complete search history.

(56) References Cited

U.S. PATENT DOCUMENTS

| 6,917,159 B2 | 7/2005 | Tyan et al. | |
| 2009/0179560 A1* | 7/2009 | Chun et al. | 313/504 |
| 2013/0099218 A1* | 4/2013 | Lee et al. | 257/40 |

FOREIGN PATENT DOCUMENTS

| KR | 10-2011-0138787 | 12/2011 |
| KR | 10-2012-0003165 | 1/2012 |

* cited by examiner

*Primary Examiner* — Cathy N Lam
(74) *Attorney, Agent, or Firm* — Christie, Parker & Hale, LLP

(57) ABSTRACT

An OLED display includes a substrate; a first electrode on the substrate; an organic emission layer on the first electrode; a second electrode on the organic emission layer; an organic layer on the second electrode and corresponding to the first electrode; and an auxiliary electrode contacting the second electrode and neighboring the organic layer.

20 Claims, 5 Drawing Sheets

ORGANIC LIGHT EMITTING DIODE DISPLAY

CROSS-REFERENCE TO RELATED APPLICATION

This application claims priority to and the benefit of Korean Patent Application No. 10-2013-0000181 filed in the Korean Intellectual Property Office on Jan. 2, 2013, the entire content of which is incorporated herein by reference.

BACKGROUND

1. Field

The described technology relates generally to an organic light emitting diode (OLED) display.

2. Description of the Related Art

A display device is a device that displays an image, and currently, organic light emitting diode (OLED) displays are in the spotlight.

Because the organic light emitting diode (OLED) display has a self-light emitting characteristic so that a separate light source is not required, unlike a liquid crystal display (LCD), a thickness and a weight thereof may be reduced. Further, because the OLED display has high quality characteristics such as low power consumption, high luminance, and high response speed, the OLED display is appropriate for use in a mobile electronic device.

A conventional OLED display includes a first electrode, an organic emission layer disposed on the first electrode, and a second electrode disposed on the organic emission layer.

An OLED display is classified into a front emission type, a rear emission type, and a dual emission type. The front emission type OLED display has a structure in which a second electrode of an organic light emitting element is formed over the entire area of a substrate where the organic light emitting element is formed in a thin film shape in order to reduce or minimize deterioration of luminance of light generated from an organic emission layer.

However, because the second electrode formed as a thin film is formed over the entire area of the substrate in the front emission type OLED display, a voltage drop occurs in driving power passing through the second electrode for driving the organic emission layer due to electrical resistance of the second electrode.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide an organic light emitting diode (OLED) display that can reduce or minimize a voltage drop of power passing through a thin and large-sized electrode for driving of an organic emission layer.

An OLED display according to one aspect of the present invention includes: a substrate; a first electrode on the substrate; an organic emission layer on the first electrode; a second electrode on the organic emission layer; an organic layer on the second electrode and corresponding to the first electrode; and an auxiliary electrode contacting the second electrode and neighboring the organic layer.

The organic layer may contact the second electrode.

The organic layer may include lithium quinolone (LiQ).

The auxiliary electrode may be on the second electrode.

The first electrode may include a plurality of first electrodes that are separated from each other and are on the substrate, and the second electrode may be located throughout the substrate.

The organic layer may include a plurality of organic layers and may be separated from each other and may be on the second electrode.

The auxiliary electrode may include a plurality of auxiliary electrodes, may be separated from each other, and may be between neighboring ones of the organic layers.

Each of the plurality of auxiliary electrodes may extend in a first direction on the substrate.

The plurality of auxiliary electrodes may be arranged in a second direction crossing the first direction on the substrate.

The plurality of auxiliary electrodes may include: a plurality of first sub-auxiliary electrodes extending in a first direction on the substrate and arranged in a second direction crossing the first direction; and a plurality of second sub-auxiliary electrodes extending in the second direction and arranged in the first direction.

The plurality of first sub-auxiliary electrodes and the plurality of second sub-auxiliary electrodes may form a mesh structure.

The OLED display may further include a thin film transistor that includes an active layer on the substrate, a gate electrode on the active layer, and a drain electrode coupling the active layer and the first electrode, and the auxiliary electrode may include a first auxiliary electrode portion at a same layer as at least one of the active layer, the gate electrode, or the drain electrode, a second auxiliary electrode portion at a same layer as the first electrode and coupled to the first auxiliary electrode portion, and a third auxiliary electrode portion coupling the second auxiliary electrode portion and the second electrode.

An end of the second auxiliary electrode portion may be tapered, the second electrode may be located throughout the substrate and is separated from the end of the second auxiliary electrode portion, and the third auxiliary electrode portion may have a slope to the end of the second auxiliary electrode portion.

The organic emission layer may be located throughout the substrate and may be separated from the end of the second auxiliary electrode portion.

The organic layer may include a plurality of organic layers that may be separated from each other and may be on the second electrode to partially expose the second electrode that neighbors the end of the second auxiliary electrode portion.

The auxiliary electrode may include a plurality of auxiliary electrodes and the third auxiliary electrode portion of each of the plurality of auxiliary electrodes may be between the organic layers.

An adherence between the third auxiliary electrode portion and the organic layer may be weaker than an adherence between the organic layer and the second electrode.

The third auxiliary electrode portion of the auxiliary electrode may include magnesium (Mg).

An adherence between the auxiliary electrode and the organic layer may be weaker than an adherence between the organic layer and the second electrode.

The auxiliary electrode may include magnesium (Mg).

According to a part of the exemplary embodiments, an OLED display is provided of which a voltage drop of power passing through a thin and large-sized electrode for driving of an organic emission layer can be reduced or minimized.

DETAILED DESCRIPTION

Figure 1:
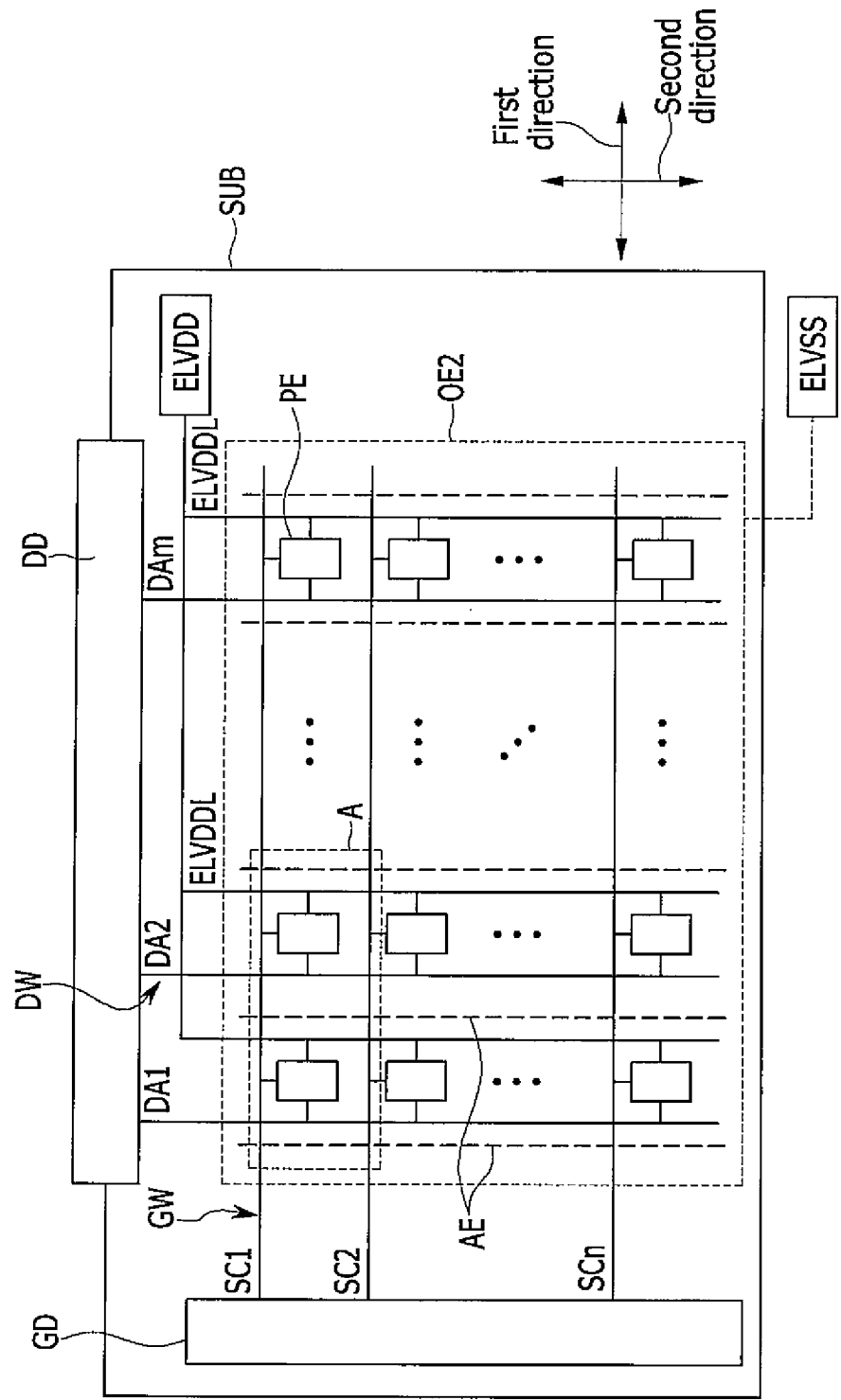
FIG. 1 shows an organic light emitting diode (OLED) display according to a first exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Furthermore, as the size and thickness of the respective structural components shown in the drawings are arbitrarily illustrated for explanatory convenience, the present invention is not necessarily limited to the illustrated.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present.

In addition, unless explicitly described to the contrary, the word "comprise", and variations such as "comprises" or "comprising", will be understood to imply the inclusion of stated elements but not the exclusion of any other elements. Further, in the specification, an upper part of a target portion indicates an upper part or a lower part of the target portion, and it does not mean that the target portion is always positioned at the upper side based on a gravity direction.

Hereinafter, an organic light emitting diode (OLED) display according to a first exemplary embodiment will be described with reference to FIG. 1 to FIG. 3.

FIG. 1 shows an OLED display according to the first exemplary embodiment.

As shown in FIG. 1, an OLED display 1000 according to the first exemplary embodiment includes a substrate SUB, a gate driver GD, a gate wires GW, a data driver DD, data wires DW, an organic layer (shown in FIG. 2), an auxiliary electrode AE, and a pixel PE. Here, the pixel PE is the unit (e.g., a minimum unit or a smallest unit) of displaying an image, and the OLED display 1000 displays an image through a plurality of pixels PE.

The substrate SUB may be formed of a transparent insulation substrate made of glass, quartz, ceramic, plastic, and/or the like. However, the first exemplary embodiment is not limited thereto, and the substrate SUB may be formed of a metallic substrate formed of stainless steel. In addition, when the substrate SUB is made of plastic, the OLED display 1000 may have a flexible characteristic, a stretchable characteristic, or a rollable characteristic.

The gate driver GD may sequentially supply scan signals to the gate wires GW corresponding to a control signal supplied from an external control circuit (not illustrated), for example, a timing controller. Then, the pixels PE may be selected by the scan signal and sequentially receive a data signal.

The gate wires GW are located (or disposed) on the substrate SUB and extend in a first direction. The gate wires GW include scan lines SC1 to SCn, and the scan line SCn is connected with the gate driver GD to receive a scan signal therefrom.

The gate wires GW of the OLED display 1000 according to the first exemplary embodiment include the scan line SCn, but gate wires of an OLED display according to another exemplary embodiment may further include an additional scan line, an initialization power line, an emission control line, and the like. In this case, the OLED display may be an active matrix (AM) type OLED having a 6Tr-2Cap (i.e., 6 transistors and 2 capacitors) structure.

The data driver DD may supply a data signal to data lines DA1 to DAm among the data wires DW corresponding to the control signal that is supplied from an external source, e.g., the timing controller. The data signal supplied to the data line DAm may be supplied to a selected pixel PE that is selected by a scan signal when the scan signal is supplied to the scan line SCn. Then, the pixel PE is charged with a voltage corresponding to the data signal and emits light with a corresponding luminance.

The data wires DW may be located (or disposed) on the gate wires GW or between the gate wires GW and the substrate SUB, and the data wires DW extend in a second direction that crosses the first direction. The data wires DW include data lines DAm and driving power source lines ELVDDL. The data line DAm is connected with the data driver DD, and may receive a data signal from the data driver DD. The driving power source line ELVDDL is connected with an external first power source ELVDD, and may receive driving power therefrom.

The organic layer WAL (shown in FIG. 2) will be described later in detail.

The auxiliary electrode AE is located (or disposed) on a second electrode OE2 and thus contacts the second electrode OE2, and extends in a second direction on the substrate SUB. There is provided a plurality of auxiliary electrodes AE, and the plurality of auxiliary electrodes AE are separated from each other, with the pixels PE interposed therebetween and each of the plurality of auxiliary electrodes AE is located (or disposed) between neighboring pixels PE. Each of the plurality of auxiliary electrodes AE is arranged in the first direction that crosses the second direction. The auxiliary electrode AE will be described later in further detail.

The pixel PE may include an organic light emitting element located (or disposed) in a crossing area of the gate wires GW and the data wires DW between neighboring auxiliary electrodes AE. The pixels PE may emit light with luminance that corresponds to a driving current that corresponds to a data signal, and may include a plurality of thin film transistors controlling a driving current flowing to the organic light emitting element and at least one capacitor. The plurality of thin film transistors and the at least one capacitor may be respectively connected with the gate wires GW and the data wires DW, and the organic light emitting element may be connected with the plurality of thin film transistors and the at least one capacitor. The organic light emitting element may be connected between the first power source ELVDD and the second power source ELVSS.

Figure 2:
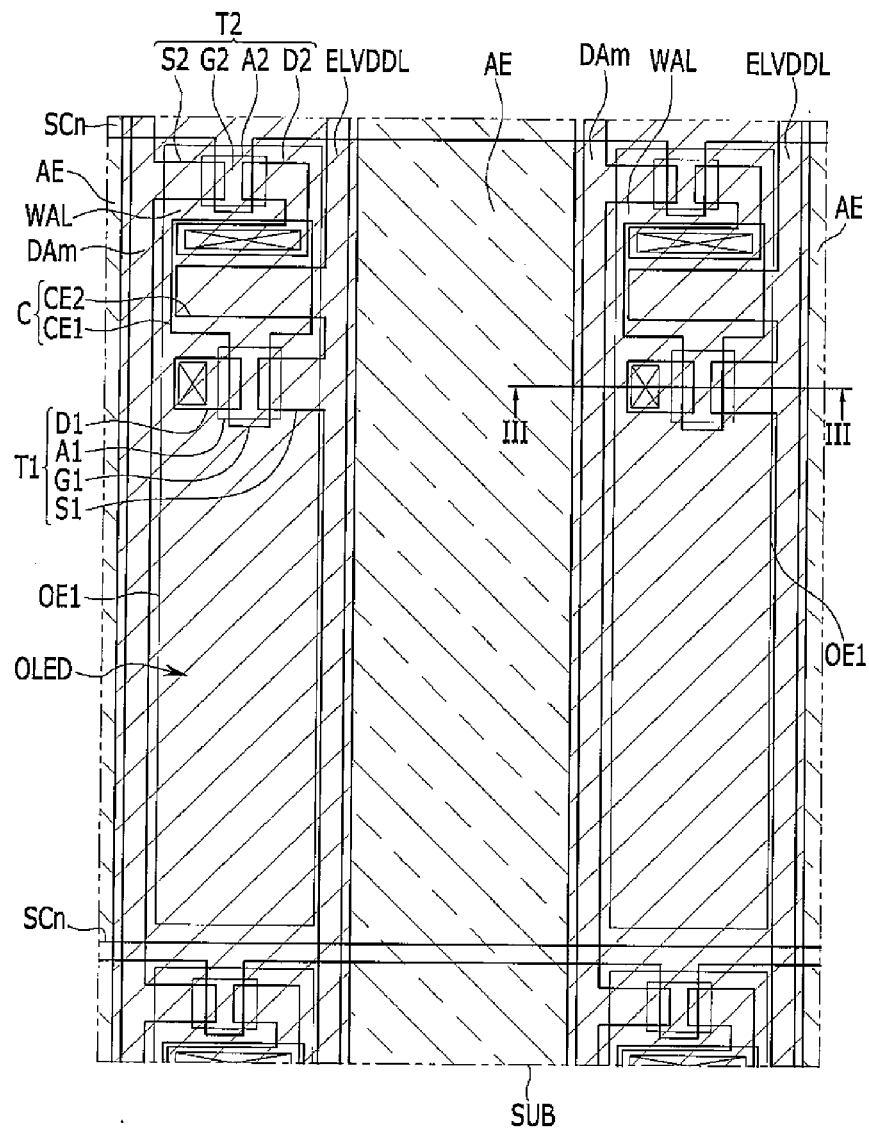
FIG. 2 is a layout view of "A" in FIG. 1.

FIG. 2 is a layout view of "A" of FIG. 1. FIG. 3 is a cross-sectional view of FIG. 2, taken along the line III-III.

Figure 3:
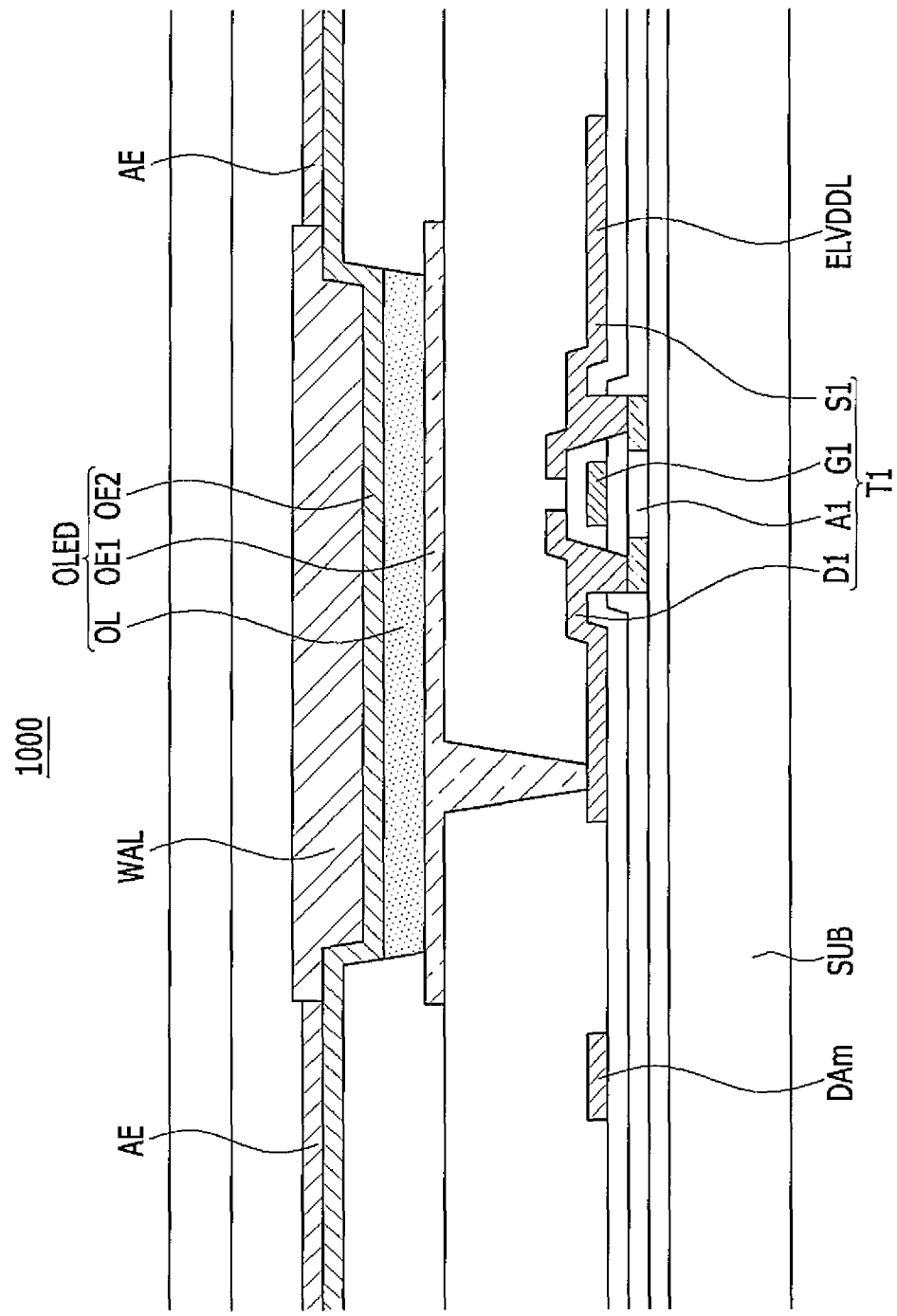
FIG. 3 is a cross-sectional view of FIG. 2, taken along the line III-III.

As shown in FIG. 2 and FIG. 3, the pixel PE includes a pixel circuit including an organic light emitting diode OLED connected between the first power source ELVDD and the second power source ELVSS, two thin film transistors connected between the organic light emitting diode OLED and the first power source ELVDD to control driving power supplied to the organic light emitting diode OLED, and one capacitor.

The pixel circuit includes a first thin film transistor T1, a second thin film transistor T2, and a capacitor C.

The first thin film transistor T1 is connected between a driving power source line ELVDDL and a first electrode OE1 of the organic light emitting diode OLED, and supplies driving power corresponding to a data signal to the organic light emitting diode OLED from the first power source ELVDD during a light emitting period of the pixel PE. That is, the first thin film transistor T1 functions as a driving transistor of the pixel PE.

The first thin film transistor T1 includes a first source electrode S1, a first drain electrode D1, a first active layer A1, and a first gate electrode G1.

The first source electrode S1 is connected with the driving power source line ELVDDL, and the first drain electrode D1 is spaced (or distanced) from the first source electrode S1, with the first active layer A1 interposed therebetween and then connected with the organic light emitting diode OLED. The first source electrode S1 and the first drain electrode D1 are formed in a layer that is different from that of the first active layer A1, but the first source electrode S1 and the first drain electrode D1 may be formed in the same layer as that of the first active layer A1. In this case, an impurity may be injected into the first source electrode S1 and the first drain electrode D1.

The first active layer A1 is located (or disposed) between the first source electrode S1 and the first drain electrode D1. The first active layer A1 may be formed of a polysilicon or an oxide semiconductor. The oxide semiconductor may include at least one of the oxides of zinc (Zn), gallium (Ga), tin (Sn) or indium (In) as a basis, or zinc oxide (ZnO), indium-gallium-zinc oxide (InGaZnO4), indium-zinc oxide (Zn—In—O), or zinc-tin oxide (Zn—Sn—O) that are complex oxides thereof. When the first active layer A1 is formed of an oxide semiconductor, a protection layer may be additionally provided to protect the oxide semiconductor that may be weak to external environment conditions such as high temperature. The first active layer A1 may be divided into a channel region, a source region, and a drain region, and the source region and the drain region may respectively be injected with an impurity.

The first gate electrode G1 is located (or disposed) on the first active layer A1, and is connected with the second drain electrode D2 of the second thin film transistor T2.

The second thin film transistor T2 couples a data line DAm and the first thin film transistor T1. The second thin film transistor T2 transmits a data signal supplied from the data line DAm to the pixel PE when a scan signal is supplied from a scan line SCn. That is, the second thin film transistor T2 functions as a switching transistor of the pixel PE.

The second thin film transistor T2 includes a second source electrode S2, a second drain electrode D2, a second active layer A2, and a second gate electrode G2.

The second source electrode S2 is connected with the data line DAm, and the second drain electrode D2 is connected with the first gate electrode G1 of the first thin film transistor T1. The second source electrode S2 and the second drain electrode D2 are formed in a layer that is different from that of the second active layer A2, but the second source electrode S2 and the second drain electrode D2 may be formed in the same layer as that of the second active layer A2. In this case, the second source electrode S2 and the second drain electrode D2 may be injected with an impurity.

The second active layer A2 is located (or disposed) between the second source electrode S2 and the second drain electrode D2. The second active layer A2 and the first active layer A1 are formed in the same layer on the substrate SUB and may be formed of the same material. The second active layer A2 may be formed of a polysilicon or an oxide semiconductor. The second active layer A2 may be divided into a channel region, a source region, and a drain region, and they may be respectively injected with an impurity.

The second gate electrode G2 is located (or disposed) on the second active layer A2 and is connected with the scan line SCn.

The capacitor C includes a first capacitor electrode CE1 and a second capacitor electrode CE2 and they are located (or disposed) opposite to each other, with an insulation layer interposed therebetween. The second capacitor electrode CE2 is connected with the driving power source line ELVDDL, and the first capacitor electrode CE1 is connected with the second drain electrode D2 and the first gate electrode G1.

The organic light emitting diode OLED includes the first electrode OE1, an organic emission layer located (or disposed) on the first electrode OE1, and a second electrode OE2 located (or disposed) on the organic emission layer OL. The first electrode OE1, which is an anode of the organic light emitting diode OLED, is connected to the driving power source line ELVDDL that is coupled to the first power source ELVDD via the pixel circuit, and the second electrode OE2, which is a cathode of the organic light emitting diode OLED, is connected to the second power source ELVSS.

A plurality of the first electrodes OE1 is provided throughout the substrate SUB, and the plurality of first electrodes OE1 are separated from each other and located (or disposed) on the substrate SUB. The second electrode OE2 is located (or disposed) throughout the substrate SUB.

The organic emission layer OL of the organic light emitting diode OLED emits light with luminance that corresponds to a driving current flowing to the organic light emitting diode OLED when driving power is supplied through the pixel circuit from the first power source ELVDD and common power is supplied from the second power source ELVSS. The organic emission layer OL of the organic light emitting diode OLED may be formed of a low polymer organic material or a high polymer organic material such as poly3,4-ethylene dioxythiophene (PEDOT). In addition, the organic emission layer OL may be formed as a multilayer including at least one of an emission layer, a hole injection layer (HIL), a hole transporting layer (HTL), an electron transporting layer (ETL), and an electron injection layer (EIL). When the multilayer includes all of the emission layers HIL, HTL, ETL, and EIL, the HIL may be located (or disposed) on the first electrode OE1, which is a positive electrode, and the HTL, the emission layer, the ETL, and the EIL may be sequentially stacked thereon. The organic emission layer OL may include a red color organic emission layer emitting light of a red color, a green organic emission layer emitting light of a green color, and a blue organic emission layer emitting light of a blue color, and the red organic emission layer, the green organic emission layer, and the blue organic emission layer may be respectively formed in a red color pixel, a green color pixel, and a blue color pixel to realize a colored image. In addition, the organic emission layer OL may include layers of the red organic emission layer, the green organic emission layer, and the blue organic emission layer together in the red color pixel, the green color pixel, and the blue color pixel, and a red color filter, a green color filter, and a blue color filter may be provided in the respective pixels to realize a colored image. Alternatively, a white organic emission layer emitting light of a white color may be formed in all of the red color pixel, the green color pixel, and the blue color pixel, and a red color filter, a green color filter, and a blue color filter may be provided in the respective pixels to realize a colored image. When a colored image is realized using the white organic emission layer and color filters, it may increase (or improve) resolution because deposition masks for deposition of the red organic emission layer, the green organic emission layer, and the blue organic emission layer to the respective pixels, that is, the red color pixel, the green color pixel, and the blue color pixels, are not needed.

When the second thin film transistor T2 is instantaneously turned on, power is supplied to the second capacitor electrode CE2 of the capacitor C from the driving power source line ELVDDL, and at the same time, power is supplied to the first capacitor electrode CE1 through the second thin film transistor T2 from the data line DAm so that the capacitor C is charged. The amount of charges charged in the capacitor C is proportional to a voltage applied from the data line DAm. In addition, a gate potential of the first thin film transistor T1 is increased according to a potential charged in the capacitor C while the second thin film transistor T2 is in the turn-off state. The first thin film transistor T1 is turned on when the gate potential exceeds a threshold voltage. Then, the voltage applied to the driving power source line ELVDDL is applied to the organic light emitting diode OLED through the first thin film transistor T1, and accordingly the organic light emitting diode OLED emits light.

The structure of the pixel PE is not limited as above-described, but may be variously modified provided that such modifications can be easily appreciated and made by a person skilled in the art.

The organic layer WAL and the auxiliary electrode AE are located (or disposed) on the second electrode OE2.

The organic layer WAL contacts the second electrode OE2 on the second electrode OE2 corresponding to the first electrode OE1. A plurality of organic layers WAL are provided and the plurality of organic layers WAL are separated from each other and located (or disposed) on the second electrode OE2. The organic layer WAL may include lithium quinolone (LiQ) that is a transparent organic material having weak adherence with a metal. The organic layer WAL may be formed on the second electrode OE2 using a micro-electro-mechanical system (MEMS) process such as photolithography. Adherence between the organic layer WAL and the auxiliary electrode AE may be weaker than adherence between the organic layer WAL and the second electrode OE2.

The auxiliary electrode AE contacts the second electrode OE2 on the second electrode OE2 while neighboring the organic layer WAL. A plurality of auxiliary electrodes AE are provided, and the plurality of auxiliary electrodes AE are separated from each other and located (or disposed) between neighboring organic layers WAL. The plurality of auxiliary electrodes AE respectively extend in a second direction on the substrate SUB and arranged in a first direction. The auxiliary electrode AE may include magnesium (Mg). Because the auxiliary electrode AE may include magnesium and the organic layer WAL may include LIQ, adherence between the auxiliary electrode AE and the organic layer WAL may be weaker than adherence between the second electrode OE2, which is a transparent electrode, and the organic layer WAL.

The auxiliary electrode AE may be formed using a so called metal self-patterning technology. For example, when the plurality of organic layers WAL that are separated from each other are formed on the second electrode OE2 and then a deposition material is deposited for forming the auxiliary electrode AE, chemical attraction does not occur between the organic layer WAL and the forming material of the auxiliary electrode AE, causing occurrence of weak adhesion therebetween. Thus, the forming material of the auxiliary electrode AE is adhered only to the second electrode OE2 located (or disposed) between the organic layers WAL, and accordingly the auxiliary electrode AE that contacts the second electrode OE2 is formed.

As described, in the OLED display 1000 according to the first exemplary embodiment, the auxiliary electrode AE that neighbors the organic layer WAL that is located (or disposed) corresponding to the first electrode OE1 contacts the second electrode OE2 so that the second electrode OE2, at a location where the auxiliary electrode AE is located (or disposed), is wholly thickened. Thus, the second electrode OE2 may cause deterioration (or a reduction) of sheet resistance, and, accordingly, a voltage drop of the second power source ELVSS, passing through the thin and large-sized second electrode OE2 for driving of the organic emission layer, can be reduced (or minimized). That is, the OLED display 1000 can be large-scaled while reducing (or minimizing) a voltage drop.

Hereinafter, an OLED display according to a second exemplary embodiment will be described with reference to FIG. 4.

Hereinafter, only characteristic components distinguished from the first exemplary embodiment will be extracted and described, and the components omitted from the description may be substantially the same as those of the first exemplary embodiment. In addition, in the second exemplary embodiment, for convenience of description, like constituent elements will be described by using like reference numerals of the first exemplary embodiment.

Figure 4:
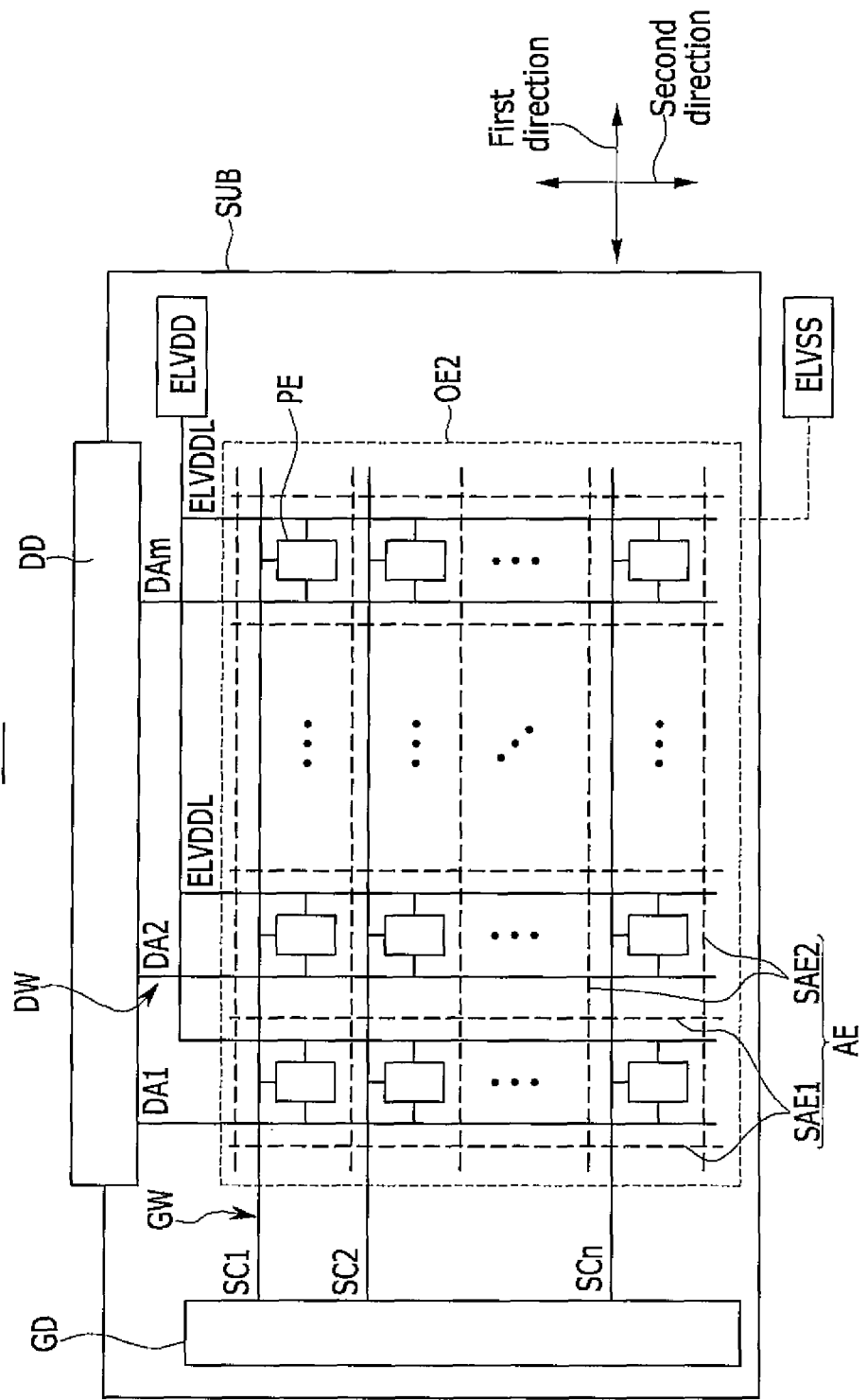
FIG. 4 shows an OLED display according to a second exemplary embodiment.

FIG. 4 shows an OLED display according to the second exemplary embodiment.

As shown in FIG. 4, a plurality of auxiliary electrodes AE of an OLED display 1002 according to the second exemplary embodiment includes a plurality of first sub-auxiliary electrodes SAE1 and a plurality of second sub-auxiliary electrodes SAE2.

The plurality of first sub-auxiliary electrodes SAE1 is extend in a second direction on a substrate SUB, and they are arranged along a first direction.

The plurality of the second sub-auxiliary electrodes SAE2 extend in the first direction on the substrate SUB, and are arranged in the second direction.

That is, the plurality of the first sub-auxiliary electrodes SAE1 and the plurality of the second sub-auxiliary electrodes SAE2 are located (or disposed) between neighboring pixels PE on the substrate SUB, and are formed in a mesh structure.

As described, in the OLED display 1002 according to the second exemplary embodiment, an auxiliary electrode AE located (or disposed) neighboring an organic layer WAL that is located (or disposed) corresponding to a first electrode OE1 includes a first sub-auxiliary electrode SAE1 and a second sub-auxiliary electrode SAE2 that contacts the second electrode OE2. The first sub-auxiliary electrode SAE1 and the second sub-auxiliary electrode SAE2 form a mesh structure, and thus the second electrode OE2, at a location where the auxiliary electrode AE is located (or disposed), becomes wholly thicker than the second electrode OE2 of the OLED display 1000 of the first exemplary embodiment. Accordingly, a voltage drop of the second power source ELVSS, passing through the second electrode OE2 that is a thin electrode having a large area for driving of the OLED display 1002, can be reduced (or minimized). That is, a voltage drop of the large-sized electrode of the OLED display 1002 can be reduced (or minimized).

Hereinafter, an OLED display according to a third exemplary embodiment will be described with reference to FIG. 5.

Hereinafter, only characteristic components distinguished from the first exemplary embodiment will be extracted and described, and the components omitted from the description are substantially the same as those of the first exemplary embodiment. In addition, in the third exemplary embodiment, for convenience of description, like constituent elements will be described by using like reference numerals as the first exemplary embodiment.

Figure 5:
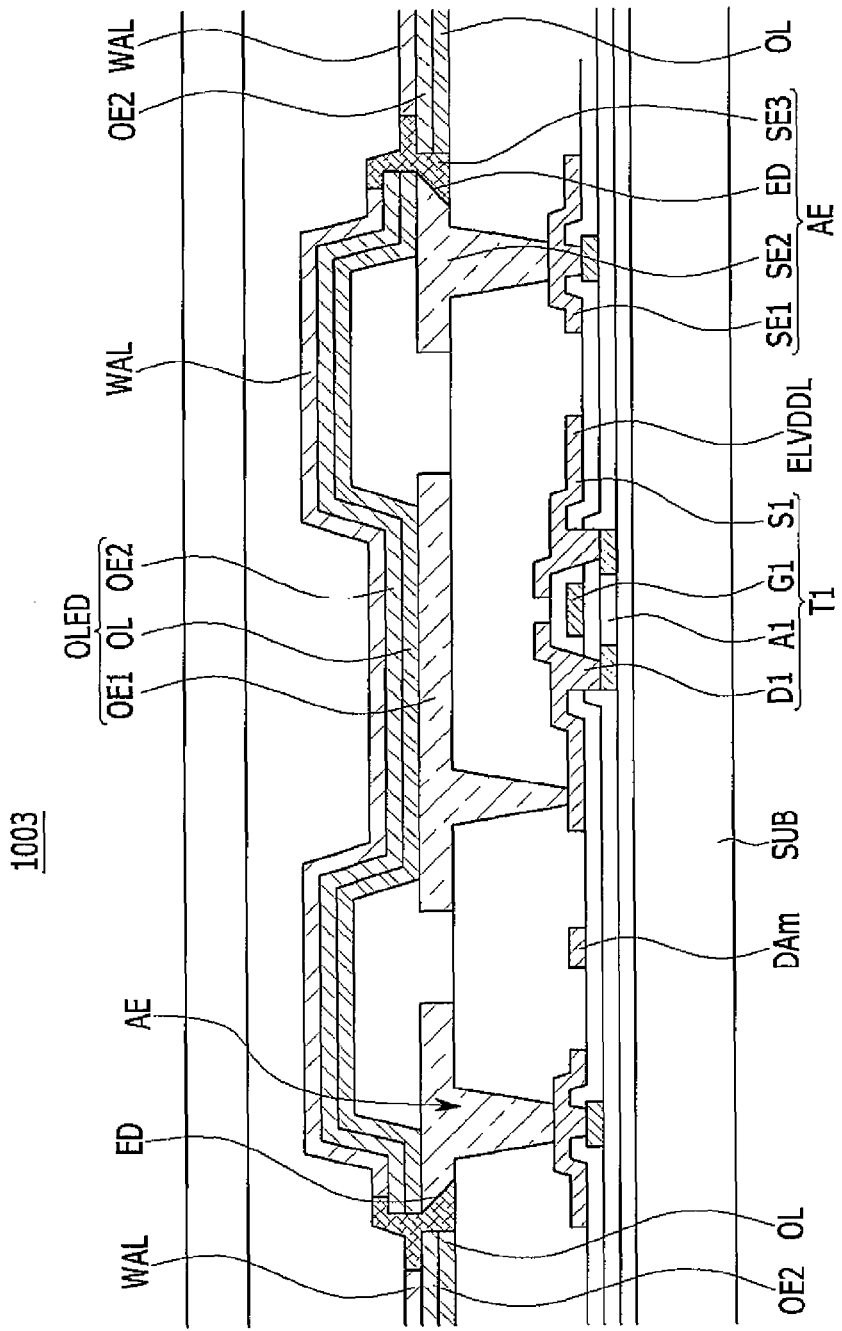
FIG. 5 is a cross-sectional view of an OLED display according to a third exemplary embodiment.

FIG. 5 is a cross-sectional view of an OLED display according to the third exemplary embodiment.

As shown in FIG. 5, an auxiliary electrode AE of an OLED display 1003 of the third exemplary embodiment includes a first auxiliary electrode portion SE1, a second auxiliary electrode portion SE2, and a third auxiliary electrode portion SE3.

The first auxiliary electrode portion SE1 is located (or disposed) in the same layer as that of a first gate electrode G1 and a first drain electrode D1 on a substrate SUB, and may be made of the same material of the first gate electrode G1 and the first drain electrode D1. The first auxiliary electrode portion SE1 may be located (or disposed) in the same layer of at least one of the first gate electrode G1, the first drain electrode D1, and/or a first active layer A1 and may be made of the same material thereof.

The second auxiliary electrode portion SE2 is located (or disposed) in the same layer as that of the first electrode OE1 and may be made of the same material thereof. The second auxiliary electrode portion SE2 is connected with the first auxiliary electrode portion SE1 through a via formed in an insulation layer. An end ED of the second auxiliary electrode portion SE2 is inversely tapered. The second auxiliary electrode portion SE2 may have a multi-layered structure in which layers of ITO, Ag, and ITO are layered in the sequence of ITO/AG/IT or AZO/Ag/ITO, and in this case, the end ED of the second auxiliary electrode portion SE2 may be formed to be inversely tapered by forming the thickness of the Ag layer to be thick and using an etching rate difference.

An organic emission layer OL and a second electrode OE2 are respectively formed throughout the substrate SUB, and because the end ED of the second auxiliary electrode portion SE2 is inversely tapered, each of the second electrode OE2 and the organic emission layer OL is separated from the end ED of the second auxiliary electrode portion SE2 while also being located (or disposed) throughout the substrate SUB.

The third auxiliary electrode portion SE3 connects the second auxiliary electrode portion SE2 and the second electrode OE2. The third auxiliary electrode portion SE3 is formed (or deposited) with a slope at the end ED of the second auxiliary electrode portion SE2. The third auxiliary electrode portion SE3 may include magnesium (Mg). Because the third auxiliary electrode portion SE3 may include magnesium and an organic layer WAL may include lithium quinolone, an adherence force between a third auxiliary electrode portion SE3 and the organic layer WAL may be weaker than an adherence force between the second electrode OE2, which is a transparent electrode, and the organic layer WAL.

The third auxiliary electrode portion SE3 may be formed (or deposited) with a slope using a metal self-patterning technology. For example, when the plurality of organic layers WAL that are separated from each other are formed on the second electrode OE2 and then a deposition material is deposited with a slope for forming the third sub-auxiliary electrode portion SE3, chemical attraction does not occur between the organic layer WAL and the forming material of the third sub-auxiliary electrode portion SE3, causing occurrence of weak adhesion therebetween. Thus, the forming material of the third sub-auxiliary electrode portion SE3 adheres only to the second electrode OE2 located (or disposed) between the organic layers WAL, and accordingly the third sub-auxiliary electrode portion SE3 that contacts the second electrode OE2 is formed.

The third auxiliary electrode portion SE3 is located (or disposed) between neighboring organic layers WAL.

The organic layer WAL corresponds to the first electrode OE1 and contacts the second electrode OE2 on the second electrode OE2. A plurality of organic layers WAL is provided, and the plurality of organic layers WAL are respectively separated from each other and located (or disposed) on the second electrode OE2 to expose a part of the second electrode OE2 that neighbors the end ED of the second auxiliary electrode portion SE2. Because the end ED of the second auxiliary electrode portion SE2 is inversely tapered, the plurality of organic layers WAL can be located (or disposed) on the second electrode OE2 to partially expose the second electrode OE2 that neighbors the end ED of the second auxiliary electrode portion SE2.

As described, in the OLED display 1003 according to the third exemplary embodiment, the auxiliary electrode AE neighbors the organic layer WAL located (or disposed) corresponding to the first electrode OE1 and includes the first auxiliary electrode portion SE1, the second auxiliary electrode portion SE2, and the third auxiliary electrode portion SE3 and contacts the second electrode OE2 so that the second electrode OE2, at a location where the auxiliary electrode AE is located, becomes wholly thickened. Thus, the second electrode OE2 may cause deterioration (or a reduction) of sheet resistance, and accordingly, a voltage drop of the second power source ELVSS that passes through the thin and large-sized second electrode OE2 for driving of the organic emission layer can be reduced (or minimized). That is, a voltage drop of the large-sized electrode of the OLED display 1003 can be reduced (or minimized).

In addition, in the OLED display 1003 according to the third exemplary embodiment, the auxiliary electrode AE is not located (or disposed) on the second electrode OE2 so that the entire aperture ratio of the OLED display 1002 is further improved compared to the OLED display 1000, thereby providing increased (or improved) image quality.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and their equivalents.

DESCRIPTION OF SOME OF THE REFERENCE CHARACTERS substrate SUB, first electrode OE1, organic emission layer OL, second electrode OE2, organic layer WAL, auxiliary electrode AE

What is claimed is:

1. An organic light emitting diode (OLED) display comprising:
    a substrate;
    a first electrode on the substrate;
    an organic emission layer on the first electrode;
    a second electrode on the organic emission layer;
    an organic layer on the second electrode and corresponding to the first electrode; and
    an auxiliary electrode contacting the second electrode and neighboring the organic layer.

2. The OLED display of claim 1, wherein the organic layer contacts the second electrode.

3. The OLED display of claim 2, wherein the organic layer comprises lithium quinolone (LiQ).

4. The OLED display of claim 2, wherein the auxiliary electrode is on the second electrode.

5. The OLED display of claim 4, wherein the first electrode comprises a plurality of first electrodes that are separated from each other and are on the substrate, and the second electrode is located throughout the substrate.

6. The OLED display of claim 5, wherein the organic layer comprises a plurality of organic layers and are separated from each other and are on the second electrode.

7. The OLED display of claim 6, wherein the auxiliary electrode comprises a plurality of auxiliary electrodes, are separated from each other, and are between neighboring ones of the organic layers.

8. The OLED display of claim 7, wherein each of the plurality of auxiliary electrodes extends in a first direction on the substrate.

9. The OLED display of claim 8, wherein the plurality of auxiliary electrodes are arranged in a second direction crossing the first direction on the substrate.

10. The OLED display of claim 7, wherein the plurality of auxiliary electrodes comprises:
    a plurality of first sub-auxiliary electrodes extending in a first direction on the substrate and arranged in a second direction crossing the first direction; and
    a plurality of second sub-auxiliary electrodes extending in the second direction and arranged in the first direction.

11. The OLED display of claim 10, wherein the plurality of first sub-auxiliary electrodes and the plurality of second sub-auxiliary electrodes form a mesh structure.

12. The OLED display of claim 2, further comprising a thin film transistor comprising an active layer on the substrate, a gate electrode on the active layer, and a drain electrode coupling the active layer and the first electrode,
    wherein the auxiliary electrode comprises,
        a first auxiliary electrode portion at a same layer as at least one of the active layer, the gate electrode, or the drain electrode,
        a second auxiliary electrode portion at a same layer as the first electrode and coupled to the first auxiliary electrode portion, and
        a third auxiliary electrode portion coupling the second auxiliary electrode portion and the second electrode.

13. The OLED display of claim 12, wherein an end of the second auxiliary electrode portion is tapered, the second electrode is located throughout the substrate and is separated from the end of the second auxiliary electrode portion, and the third auxiliary electrode portion has a slope to the end of the second auxiliary electrode portion.

14. The OLED display of claim 13, wherein the organic emission layer is located throughout the substrate and is separated from the end of the second auxiliary electrode portion.

15. The OLED display of claim 13, wherein the organic layer comprises a plurality of organic layers that are separated from each other and are on the second electrode to partially expose the second electrode that neighbors the end of the second auxiliary electrode portion.

16. The OLED display of claim 15, wherein the auxiliary electrode comprises a plurality of auxiliary electrodes and the third auxiliary electrode portion of each of the plurality of auxiliary electrodes is between the organic layers.

17. The OLED display of claim 16, wherein an adherence between the third auxiliary electrode portion and the organic layer is weaker than an adherence between the organic layer and the second electrode.

18. The OLED display of claim 17, wherein the third auxiliary electrode portion of the auxiliary electrode comprises magnesium (Mg).

19. The OLED display of claim 1, wherein an adherence between the auxiliary electrode and the organic layer is weaker than an adherence between the organic layer and the second electrode.

20. The OLED display of claim 19, wherein the auxiliary electrode comprises magnesium (Mg).

* * * * *